(12) United States Patent
Terada et al.

(10) Patent No.: US 6,831,356 B2
(45) Date of Patent: Dec. 14, 2004

(54) MEMORY MACRO AND SEMICONDUCTOR INTEGRATED CIRCUIT

(75) Inventors: Yutaka Terada, Hirakata (JP); Hironori Akamatsu, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/701,422

(22) Filed: Nov. 6, 2003

(65) Prior Publication Data

US 2004/0093456 A1 May 13, 2004

(30) Foreign Application Priority Data

Nov. 8, 2002 (JP) ........................................ 2002-324887

(51) Int. Cl.[7] .............................................. H01L 23/52
(52) U.S. Cl. ...................................... 257/691; 257/208
(58) Field of Search ............................... 257/691, 296, 257/210, 207, 208, 211

(56) References Cited

U.S. PATENT DOCUMENTS

| | | | |
|---|---|---|---|
| 4,910,574 A | 3/1990 | Aipperspach et al. | |
| 6,317,353 B1 * | 11/2001 | Ikeda et al. | 365/63 |
| 6,529,406 B1 | 3/2003 | Namekawa | |
| 6,617,621 B1 * | 9/2003 | Gheewala et al. | 257/207 |
| 6,657,307 B2 * | 12/2003 | Iwamoto | 257/773 |
| 6,696,712 B1 * | 2/2004 | Yonesaka | 257/207 |
| 6,707,139 B2 * | 3/2004 | Fujii et al. | 257/678 |
| 6,727,532 B2 * | 4/2004 | Saotome et al. | 257/211 |

* cited by examiner

*Primary Examiner*—S. V. Clark
(74) *Attorney, Agent, or Firm*—Stevens, Davis, Miller & Mosher, LLP (57) ABSTRACT

A memory array portion, a connection circuit serving as an interface of the memory array portion and a signal wiring connecting the memory array portion to the connection circuit are provided. Mesh wirings comprising first and second wiring layers are provided on the memory array portion. The connection circuit is connected to a plurality of signal lines comprising a third wiring layer provided on the memory array portion, the connection circuit or the signal wiring, through an intermediate wiring comprising the second wiring layer. The region where the intermediate wiring is provide on the memory array portion or on the signal wiring, and the mesh wiring comprising the second wiring layer is not present on the region where the intermediate wiring is provided.

18 Claims, 11 Drawing Sheets

FIG. 11

MEMORY MACRO AND SEMICONDUCTOR INTEGRATED CIRCUIT

BACKGROUND OF THE INVENTION

1. Field of the Invention

The present invention relates to a memory macro such as an SRAM, and a semiconductor integrated circuit such as a system LSI provided with a plurality of macros including a memory macro. "A memory macro" may be design data corresponding to a memory block which design data is used for generating semiconductor integrated circuit layout data, or a block on a semiconductor integrated circuit which block corresponds to the design data.

2. Prior Art

Semiconductor integrated circuits have ever-increasing in scale, various kinds of macros constituting a system are placed together thereon, and semiconductor integrated circuits have been increasingly constructed as one chip as a system LSI. Memory circuits are no exception. Moreover, the memory capacity used on system LSIs tends to increase, particularly, with increase in image processing. This is more conspicuous in the case of SRAM macros suitable for high-speed processing such as image processing.

Examples of the various kinds of macros include analog circuits such as PLL circuits and AD/DA converters, and interface circuits such as USB and IEEE 1394. Moreover, digital circuits such as microcomputer blocks are sometimes expressed as one macro on larger-scale system LSIs. For example, blocks in a logic circuit 40 of FIG. 9 correspond to macros.

In the development of system LSIs, with respect to such various kinds of macros such as memory macros, it is typical that, first, development is performed for ensuring the performance of each individual macro and in the highest development of system LSIs, various kinds of macros are placed together at the same time.

Figure 11:
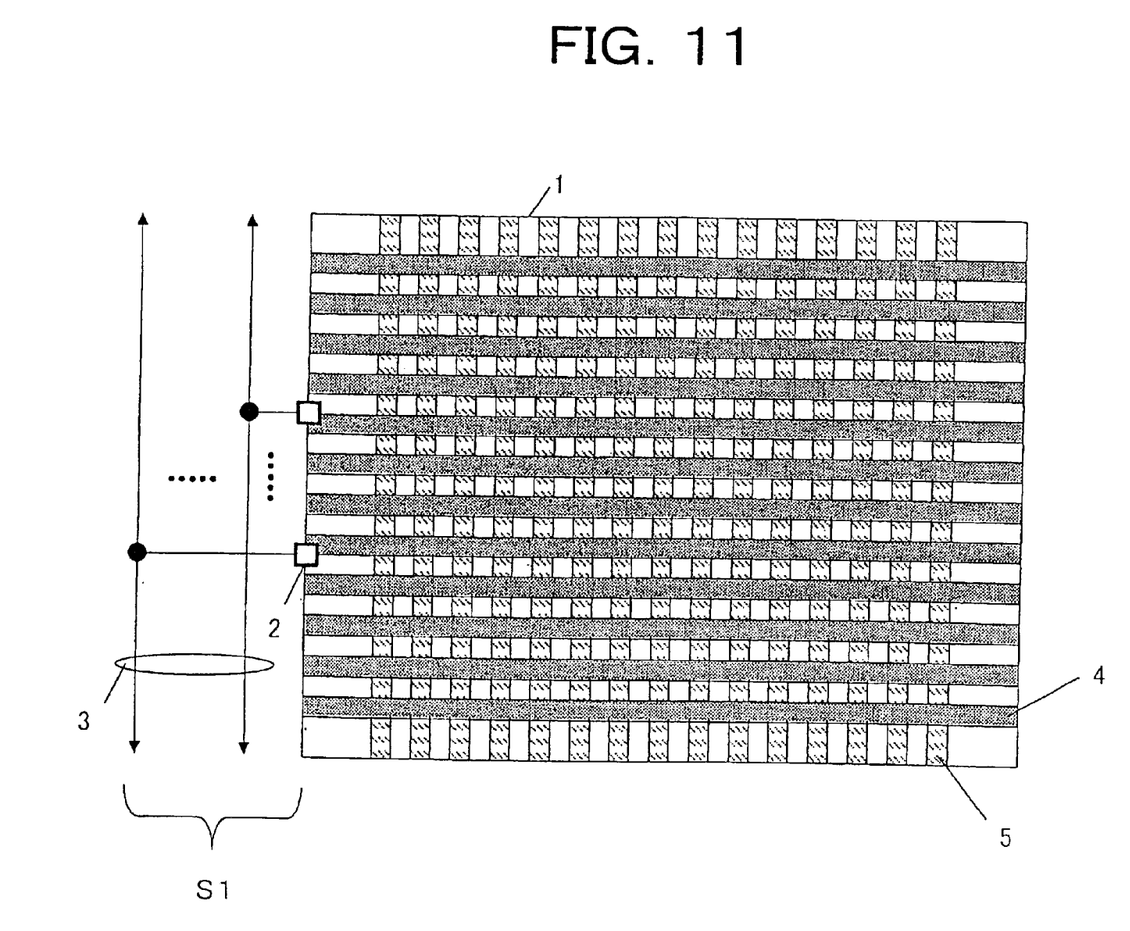
FIG. 11 is a schematic view showing the arrangement of the conventional memory macro.

FIG. 11 shows a typical memory macro and wirings around terminals of the memory macro (see, for example, Japanese Laid-Open Patent Application No. H11-134870). In FIG. 11, reference numeral 1 represents the memory macro, and reference numeral 2 represents terminals serving as contacts with the outside. The number of terminals 2 is the same as the number of signal lines necessary for the operation of the memory macro 1. Reference numeral 3 represents wirings (external wirings) connecting the terminals 2 to macros other than the macro 1. The memory macro 1 frequently shares signal lines with a plurality of other memory macros, and the arrangement is frequently as shown in FIG. 11. The macros other than the memory macro 1 are other memory macros and memory controllers controlling these memory macros. Memories cannot operate unless at least connected to a control circuit such as a memory controller. Further, there are cases where a plurality of memories are connected together with a data bus being shared thereamong.

Reference numerals 4 and 5 represent power lines and ground lines (intra-memory-macro wirings) being present in the memory macro 1 and supplying charges necessary for the operation of the circuits of the memory macro 1. The power lines and ground lines 4 and 5 have a power potential and a ground potential, respectively, and are arranged so as to form meshes inside the memory macro 1. Wirings of the same potential are connected together. The power lines and ground lines 4 and 5 are capable of connecting with power lines and ground lines outside the memory macro 1 at the ends of the memory macro 1. From that characteristic, a wiring layer of a high layer of the layers being used is frequently used. Reference designation S1 represents a region width of the wirings 3 present outside the memory macro 1.

As shown in FIG. 11, the memory macro 1 comprises the terminals 2, and the power lines and ground lines 4 and 5. At this level, this structure is supplied as the memory macro 1 for forming a system LSI. The wirings 3 are placed by the development of a high layer outside the memory macro 1. To ensure the operation of the memory macro 1, in many cases, wiring patterns on other layers not used by the memory macro 1 are not admitted on the memory macro 1.

However, in the structure as shown in FIG. 11, since the positions of the terminals 2 are fixed, there is a restriction on the pattern of the wirings 3, and a region area with a width S1 is occupied as shown in FIG. 11. This region is proportional to the number of wirings. Consequently, when the capacity of the memory macro 1 increases, the number of wirings increases, and the occupied area tends to increases. For example, in the case of a several-megabit-class SRAM, in some structures, the number of wirings 3 is several tens, and compared to the area of the memory macro 1, the wirings 3 occupy several to a dozen or so percent thereof.

Further, since wirings on the memory macro 1 in other layers are indispensable as mentioned above, in many cases, the memory macro 1 itself is a restriction on the wiring when the floor plan of the system LSI is examined. In these cases, the area of the memory macro 1 itself tends to increase as the memory capacity increases, and its restriction is extremely large. Consequently, a wiring detouring around the memory macro 1 is required, and this increases the wiring region and causes performance deterioration due to increase in wiring length.

These problems attributable to the memory macro 1 are caused because the memory macro 1 is developed independently of the development of the system LSI. However, there are cases where the memory macro 1 is mounted on a plurality of system LSIs, and it is, conversely, inefficient to develop a memory macro 1 optimized for each individual system LSI.

SUMMARY OF THE INVENTION

Accordingly, an object of the present invention is to provide a memory macro and a semiconductor integrated circuit capable of reducing the area occupied by the wirings on high layers without any versatility degradation.

Another object of the present invention is to provide a memory macro and a semiconductor integrated circuit capable of reducing a restriction on the wirings in a high level (chip level) without any versatility degradation.

To achieve the above-mentioned objects, the present invention provides a memory macro and a semiconductor integrated circuit considering development in the high level and provided with versatility.

Specifically, a memory macro and a semiconductor integrated circuit considering development in the high level are provided.

This includes:

1. optimization of interface wirings between the memory macro and external circuits; and
2. provision of feed through wiring regions passing over the memory macro.

That is, in 1, wirings disposed in the high level are previously taken in the memory macro to thereby reduce the wiring region. Moreover, area reduction is realized by supplying a memory macro with an improved degree of freedom of the wiring patterns in the high level.

Further, in 2, by providing passage wiring regions on the memory macro while ensuring the performance of the memory macro, improvement of the performance as a system LSI and area reduction are realized.

A memory macro according to a first aspect of the invention comprises: a memory array portion; an interface circuit serving as an interface of the memory array portion; and a wiring region connecting the memory array portion to the interface circuit. Mesh power wirings comprising first and second wiring layers are provided on the memory array portion. The interface circuit is connected to a plurality of signal lines comprising a third wiring layer provided on the memory array portion, the interface circuit or the wiring region, through an intermediate wiring comprising the second wiring layer. A region where the intermediate wiring is provided comprises a region on the memory array portion or on the wiring region. The mesh power wiring comprising the second wiring layer is not present on the region where the intermediate wiring is provided. The region where the intermediate wiring is provided sometimes includes on the interface circuit.

According to this structure, the interface circuit is connected to the plurality of signal lines comprising the third wiring layer through the intermediate wiring comprising the second wiring layer, the region where the intermediate region is provided is disposed on the memory array portion or the wiring region, and the mesh power wiring comprising the second wiring layer is not present on the region where the intermediate wiring is provided. Since this enables wirings to be provided on the memory macro, the area occupied by the wirings on high layers can be reduced without any versatility degradation.

In the structure of the first aspect of the invention, it is preferable that the plurality of signal lines be placed from one side of a region including the memory array portion, the interface circuit and the wiring region, to an opposite side of the region and a signal terminal be provided on each end of each of the signal lines.

According to this structure, since the plurality of signal lines is placed from one side of the region including the memory array portion, the interface circuit and the wiring region, to the side on the opposite side of the region and the signal terminal is provided on each end of the signal lines, when a plurality of memory macros is connected by the signal lines, only wiring regions on high layers between memory macros are necessary, so that the wiring regions of the signal lines can be significantly reduced.

In the above-described structure, it is preferable that specifications be provided for a position, a width, an interval and the like of the signal terminal on each end of the plurality of signal lines so that consistency with other macro is attained.

According to this structure, wiring can be easily performed when macros of different sizes are connected together by the signal lines.

A memory macro according to a second aspect of the invention comprises: a memory array portion; an interface circuit serving as an interface of the memory array portion; and a wiring region connecting the memory array portion to the interface circuit. Mesh power wirings comprising first and second wiring layers are provided on a region on the memory array portion. The interface circuit is connected to a terminal for connection to a plurality of signal lines provided on the memory array portion, the interface circuit or the wiring region, through an intermediate wiring comprising the second wiring layer. A region where the intermediate wiring is provided comprises a region on the memory array portion or on the wiring region, and the mesh power wiring comprising the second wiring layer is not present on the region where the intermediate wiring is provided. The region where the intermediate wiring is provided sometimes includes on the interface circuit.

According to this structure, the signal lines can be freely disposed as well as similar effects to those of the first aspect of the invention are obtained, so that the degree of freedom of high-layer wirings can be increased.

In the above-described structure of the first or the second aspect of the invention, it is preferable that the memory array portion and the interface circuit be structured by use of a wiring layer other than the first, the second and the third wiring layers.

According to this structure, the memory array portion and the interface circuit are never restrictions on the formation of the signal lines and the intermediate wiring.

Moreover, in the above described structure of the first or the second aspect of the invention, it is preferable that power terminals supplying power to the power wirings be provided at least on opposing two sides of a region including the memory array portion and specifications be provided for a position, a width, an interval and the like of the power terminals so that consistency with other macro is attained.

According to this structure, wiring can be easily performed when macros of different sizes are connected together by the signal lines.

In the above-described structure of the first or the second aspect of the invention, the first wiring layer consist of, for example, a fourth layer of six layers of metal wirings, the second wiring layer consist of, for example, a fifth layer of the six layers of metal wirings, and the third wiring layer consist of, for example, a sixth layer of the six layers of metal wirings.

In the above-described structure of the first or the second aspect of the invention, it is preferable that in a region including the memory array portion, the interface circuit and the wiring region, the interface circuit be disposed at an end.

According to this structure, since the symmetry of the memory array portion is never degraded, the occupied area can be reduced.

In the above-described structure, the region including the memory array portion, the interface circuit and the wiring region has a convex shape where the interface circuit is situated in a protruding part, and other circuit block is formed in a dead space present at a side of the protruding part where the interface circuit is disposed.

According to this structure, since other circuit block is formed in the dead space formed at a side of the interface circuit, the dead space can be reduced when a semiconductor integrated circuit is structured, so that size reduction of the semiconductor integrated circuit can be achieved.

In the above-described structure of the first or the second aspect of the invention, it is preferable that a region for feed through comprising the second wiring layer be provided on the memory array portion, the interface circuit or the wiring region.

According to this structure, since the region for feed through comprising the second wiring layer is provided on the memory array portion, the interface circuit or the wiring region, the degree of freedom of wiring can be increased, so that the degree of freedom of the layout can be significantly increased.

In the above-described structure, the region for feed through is provided, for example, on the region where the mesh power wiring comprising the second wiring layer is not present, the mesh power wiring comprising the second wiring layer is present on a signal line comprising a wiring layer other than the second wiring layer which signal line is on the memory array portion, the interface circuit or the wiring region, and the region for feed through is disposed, for example, on a region where the signal line comprising the wiring layer other than the second wiring layer which signal line is on the memory array portion, the interface circuit or the wiring region is not present or on a power line or a ground line on the memory array portion, the interface circuit or the wiring region which power line and ground line comprise the second wiring layer.

According to this structure, adverse effects of the feed through wiring on the circuits in the memory macro can be minimized.

In the above-described structure, it is preferable that a first circuit for feed through wiring be provided in the wiring region.

The first circuit in the above-described structure is, for example, a signal amplifier.

According to this structure, the signal passing through the feed through wiring can be amplified by the signal amplifier, so that signal blunting and delay can be eliminated.

In the above-described structure, an input terminal of the first circuit is fixed, for example, at a power potential or a ground potential through a high-resistance device on the memory array portion, the interface circuit or the wiring region, and is connected to the signal line when the first circuit is used as a buffer.

According to this structure, since the input of the first circuit is fixed, the memory macro is prevented from being adversely affected.

A semiconductor integrated circuit according to a third aspect of the invention is provided with the above-described memory macro according to the first or the second aspect of the invention. When a signal line is placed in a direction that crosses the signal lines comprising the third wiring layer, the signal line is provided on the memory macro by use of the second wiring layer, and when the signal line is placed parallel to the signal lines comprising the third wiring layer, the signal line is provided on the memory macro by use of the third wiring layer.

According to this structure, since the signal line can be placed on the memory macro by use of the second wiring layer or the third wiring layer, the degree of freedom of the layout of the semiconductor integrated circuit increases, so that reduction in layout area is facilitated.

A semiconductor integrated circuit according to a fourth aspect of the invention is a semiconductor integrated circuit comprising at least one memory macro and other macro. The at least one memory macro comprises: a memory array portion; an interface circuit serving as an interface of the memory array portion; and a wiring region connecting the memory array portion to the interface circuit. Mesh power wirings comprising first and second wiring layers are provided on the memory array portion. The interface circuit is connected to a plurality of signal lines comprising a third wiring layer provided on the memory array portion, the interface circuit or the wiring region, through an intermediate wiring comprising the second wiring layer. A region where the intermediate wiring is provided comprises a region on the memory array portion or on the wiring region. The mesh power wiring comprising the second wiring layer is not present on the region where the intermediate wiring is provided.

According to this structure, the interface circuit is connected to the plurality of signal lines comprising the third wiring layer through the intermediate wiring comprising the second wiring layer, the region where the intermediate wiring is provided is disposed on the memory array portion or the wiring region, and the mesh power wiring comprising the second wiring layer is not present on the region where the intermediate wiring is provided. Since this enables wirings to be provided on the memory macro, the area occupied by the wirings high layers can be reduced.

In the structure of the fourth aspect of the invention, it is preferable that a region for feed through comprising the second wiring layer be provided on the memory array portion, the interface circuit or the wiring region.

According to this structure, since the region for feed through comprising the second wiring layer is provided on the memory array portion, the interface circuit or the wiring region, the degree of freedom of wiring can be increased, so that the degree of freedom of the layout can be significantly increased.

In the above-described structure, the region for feed through is provided on the region where the mesh power wiring comprising the second wiring layer is not present, the mesh power wiring comprising the second wiring layer is present on a signal line comprising a wiring layer other than the second wiring layer which signal line is on the memory array portion, the interface circuit or the wiring region, and the region for feed through is disposed, for example, on a region where the signal line comprising the wiring layer other than the second wiring layer which signal line is on the memory array portion, the interface circuit or the wiring region is not present or on a power line or a ground line on the memory array portion, the interface circuit or the wiring region.

According to this structure, adverse effects of the feed through wiring on the circuits in the memory macro can be minimized.

As described above, according to the present invention, the wiring region on the highest layer can be significantly reduced, so that the area as a semiconductor integrated circuit (system LSI) can be reduced. Consequently, improvement in the overall performance of the semiconductor integrated circuit and reduction in the unit cost of the chip can be realized.

DESCRIPTION OF THE PREFERRED EMBODIMENTS OF THE INVENTION

Hereinafter, embodiments of the present invention will be described with reference to the drawings.

(First Embodiment)

Figure 1:
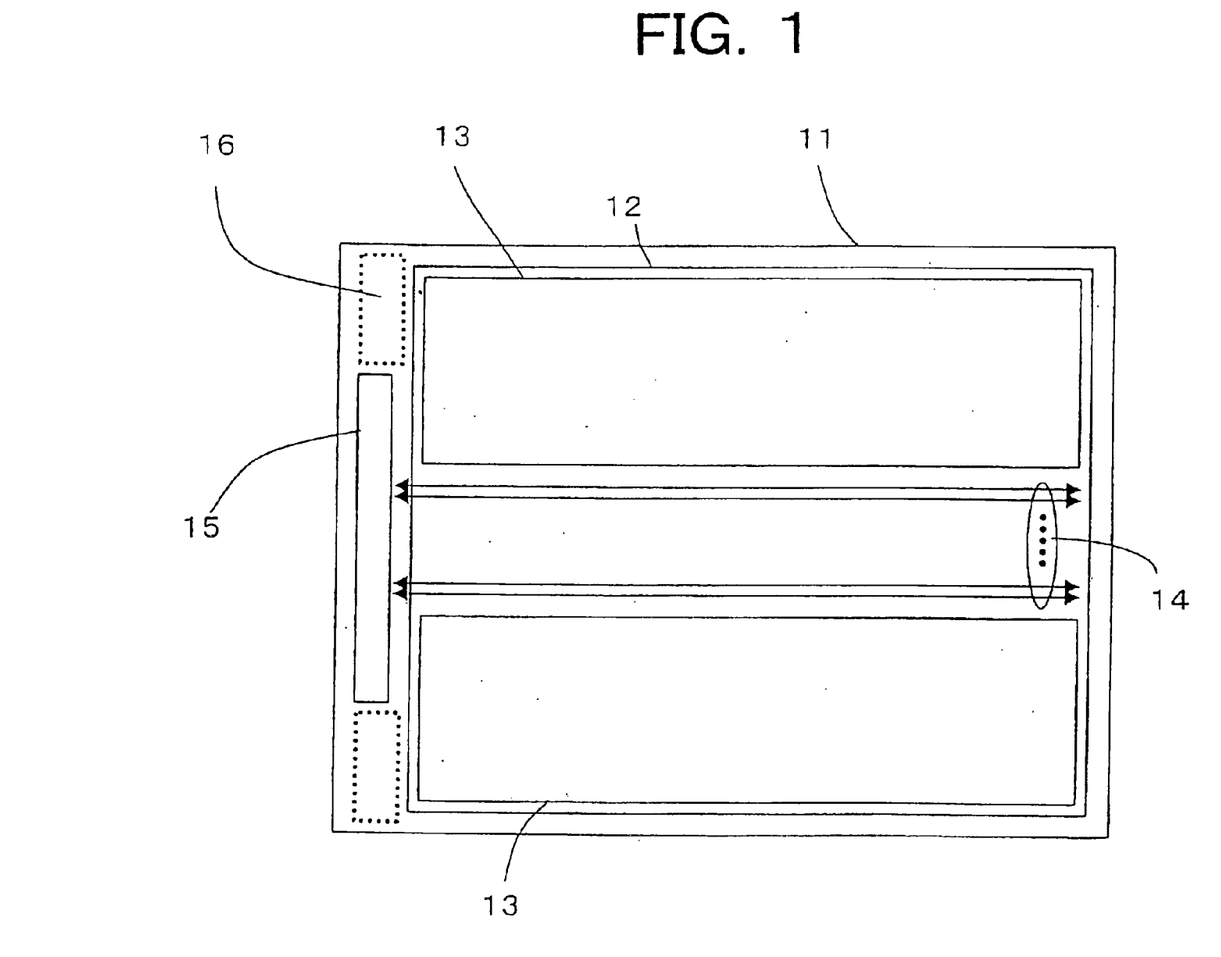
FIG. 1 is a schematic view illustrating the structure of a memory macro according to a first embodiment.

In FIG. 1, reference numeral 11 represents a memory macro described in an embodiment of the present invention. Reference numeral 12 represents a memory portion that has memory array portions 13 comprising a plurality of memory cells and a plurality of signal wirings (intra-memory wirings) 14 disposed inside. In this example, two memory array portions 13 are provided in the memory portion 12, and a plurality of signal wirings (wiring region) 14 are disposed so as to pass between the two memory array portions 13. Reference numeral 15 represents a connection circuit for connecting the memory portion 12 to an external circuit block. This connection circuit has a function as an interface circuit. The memory macro 11 comprises the memory portion 12 and the connection circuit 15.

While the memory portion 12 also has a logic circuit portion for normally performing the operation of the memory portion 12 itself, this is not specifically shown in the figure. By the memory arrays 13 being accessed through the connection circuit 15 for connection to a circuit block outside the memory macro 11 and a plurality of signal wirings 14, a series of memory operations of reading and writing is performed.

First, characteristics of the inside of the memory macro 11 will be described. The memory macro 11 comprises the memory portion 12 and the connection circuit 15, and the memory portion 12, which is structured with emphasis on the memory array portions 13, has an extremely symmetrical arrangement pattern. This applies to all kinds of memory circuits such as SRAMs and DRAMs.

The connection circuit 15 comprises a logic circuit necessary for connection to the outside and a buffer for driving the input and output loads, and its circuit scale increases as the memory capacity increases. Since the memory portion 12 itself has a symmetrical layout, disposing the connection circuit 15 inside the memory portion 12 degrades the symmetry and increases the area. Therefore, it is optimum to independently dispose the connection circuit 15 outside the memory portion 12 as shown in FIG. 1. That is, the connection circuit 15 is disposed at an end of the memory macro 11. In this case, the shape embracing the elements of the memory macro 11 is a convex shape where part of one side is protruding (substantially rectangular shape), and the connection circuit 15 is disposed in the protruding part. It is desirable to form (dispose) other circuits of the system LSI in the dead spaces on both sides thereof.

However, when the elements are arranged as shown in FIG. 1, the width of the connection circuit 15 does not always coincide with the width of the memory portion 12. Therefore, that an empty space 16 is left on each side of the connection circuit 15, for example, is a defect. By disposing other circuit blocks of the system LSI in the empty spaces 16, the dead spaces can be eliminated, which is effective in reducing the area of the system LSI.

The memory portion 12 comprises wirings of five layers, and the signal wirings 14 correspond to fifth-layer wirings. The present embodiment will be described as a six-layer wiring structure. Mesh wirings described later comprise fourth- and fifth-layer wirings. The sixth-layer wirings are metal wirings.

Although no problem is caused in wirings of not more than five layers, when the memory array portions and the interface circuit are structured by use of wiring layers other than the first, the second and the third wiring layers, for attaining consistency therewith, the connection circuit 15 is structured by wirings of not more than three layers. While the memory portion 12 as a unit comprises wirings of three layers, it is formed by five wiring layers when the fourth and the fifth wiring layers of a mesh power source are included.

Figure 2:
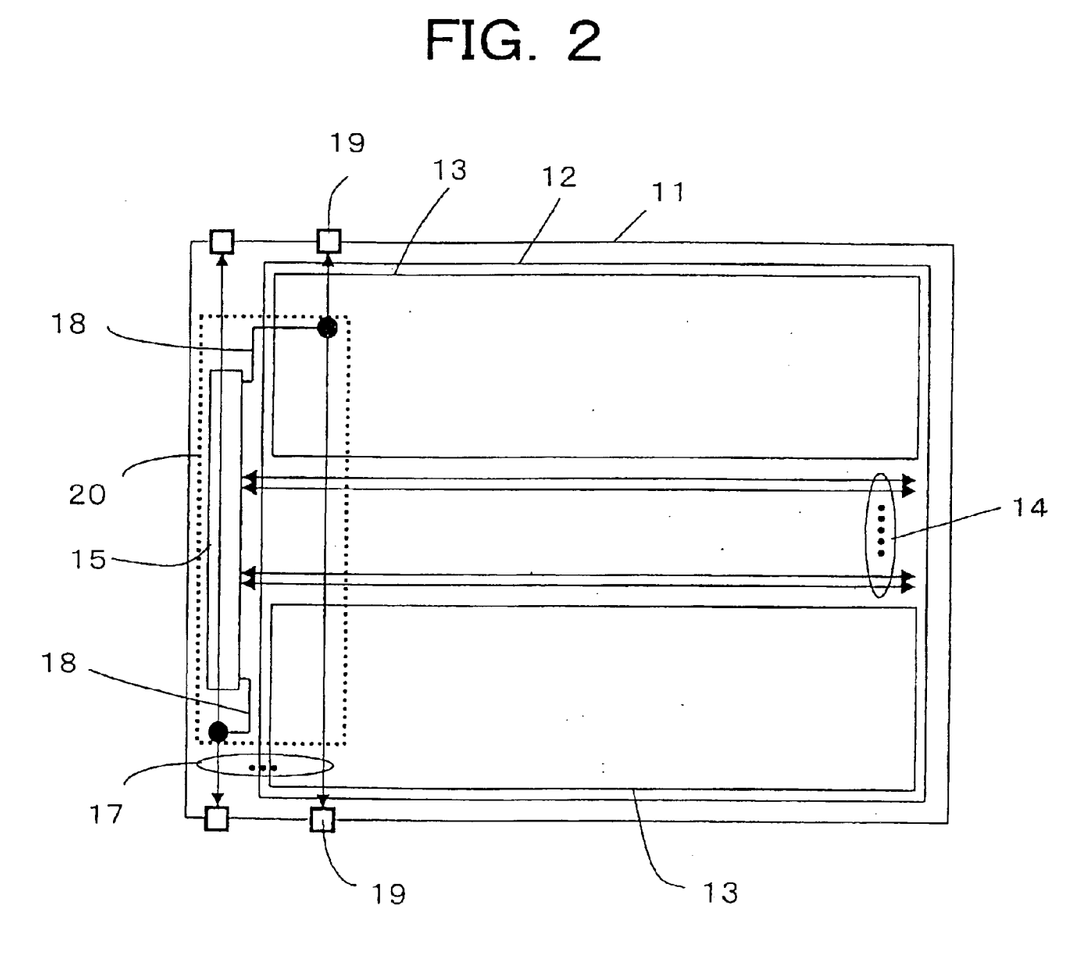
FIG. 2 is a schematic view in which wirings and terminals are added to the structure of FIG. 1.

FIG. 2 shows a structure in which terminals for connection to the outside and wirings for connection to the terminals are added to the structure of FIG. 1.

Reference numeral 19 represents the terminals (signal terminals) for connection between the memory macro 11 and the outside. Reference numerals 17 and 18 represent the wirings for connection between the connection circuit 15 and the terminals 19. Reference numeral 20 represents the region of the wirings (intermediate wirings) 18 connecting together the connection circuit 15 and the wirings (a plurality of signal lines) 17 connected to the terminals 19. The region 20 sometimes includes not only on the memory array portion 13 but also on the connection circuit 15 serving as the interface circuit.

The signal wirings 14 and the wirings 17 cannot be placed on the same layer because they are orthogonal to each other. The wirings 17, which are disposed on the memory portion 12 and the connection circuit 15, are provided as a layer higher than the layers used by the wirings 17 and the memory portion 12, that is, the sixth wiring layer.

However, the wirings 18 connecting the connection circuit 15 and the wirings 17 together cannot be placed on the same layer as the wirings 17 because they are orthogonal to the wirings 17. Therefore, it is necessary to secure a region for the wirings 18. In this case, using another layer is one solution when it is possible to do so. However, in the present embodiment, since the highest layer is the sixth layer and the number of layers is limited, wiring cannot be performed unless some measure is taken. Therefore, in the present embodiment, the following measure is taken. This measure will be described with reference to FIG. 3 and succeeding figures.

Figure 3:
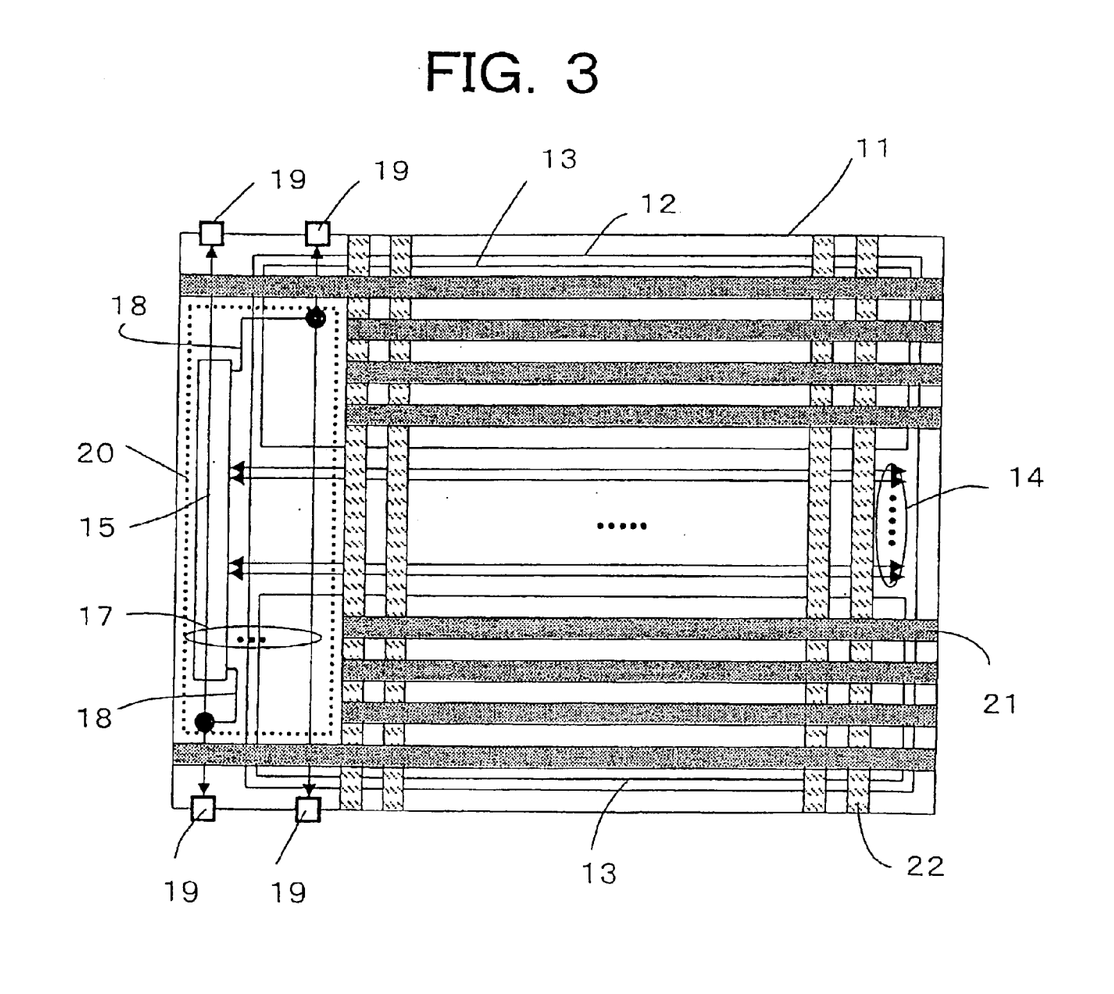
FIG. 3 is a schematic view in which mesh wirings in the longitudinal and the lateral directions are added to the structure of FIG. 2.

FIG. 3 shows a structure in which lateral wirings 21 and longitudinal wirings 22 (intra-memory-macro wirings) constituting mesh wirings (power and ground wirings) are added to the structure of FIG. 2. The lateral wirings 21 and the longitudinal wirings 22 constituting the mesh wirings are disposed in substantially the entire area on the memory macro 11 as described with reference to FIG. 11. The lateral wirings 21 are fifth-layer wirings, and the longitudinal wirings 22 are fourth-layer wirings. Since the signal wirings 14 are fifth-layer wirings, the lateral wirings 21 cannot be disposed where the signal wirings 14 are present (see FIG. 3).

It is necessary to secure a region 20 for the wirings 18. Therefore, the fifth layer is secured for connection to the wirings 17 comprising sixth-layer wirings. To do so, a part, corresponding to the region 20, of the lateral wirings (fifth-layer wirings) 21 constituting the mesh wirings are deleted. By doing this, the connection circuit 15 and the wirings 17 are connected together through the wirings 18 comprising fifth-layer wirings.

Since the mesh wirings, that is, the lateral wirings 21 and the longitudinal wirings 22 include a large number of wirings and resistance is significantly reduced by connecting the wirings 21 and 22 at the points of intersection thereof, performance is not significantly degraded even though a part of the wiring region is cut.

Figure 4:
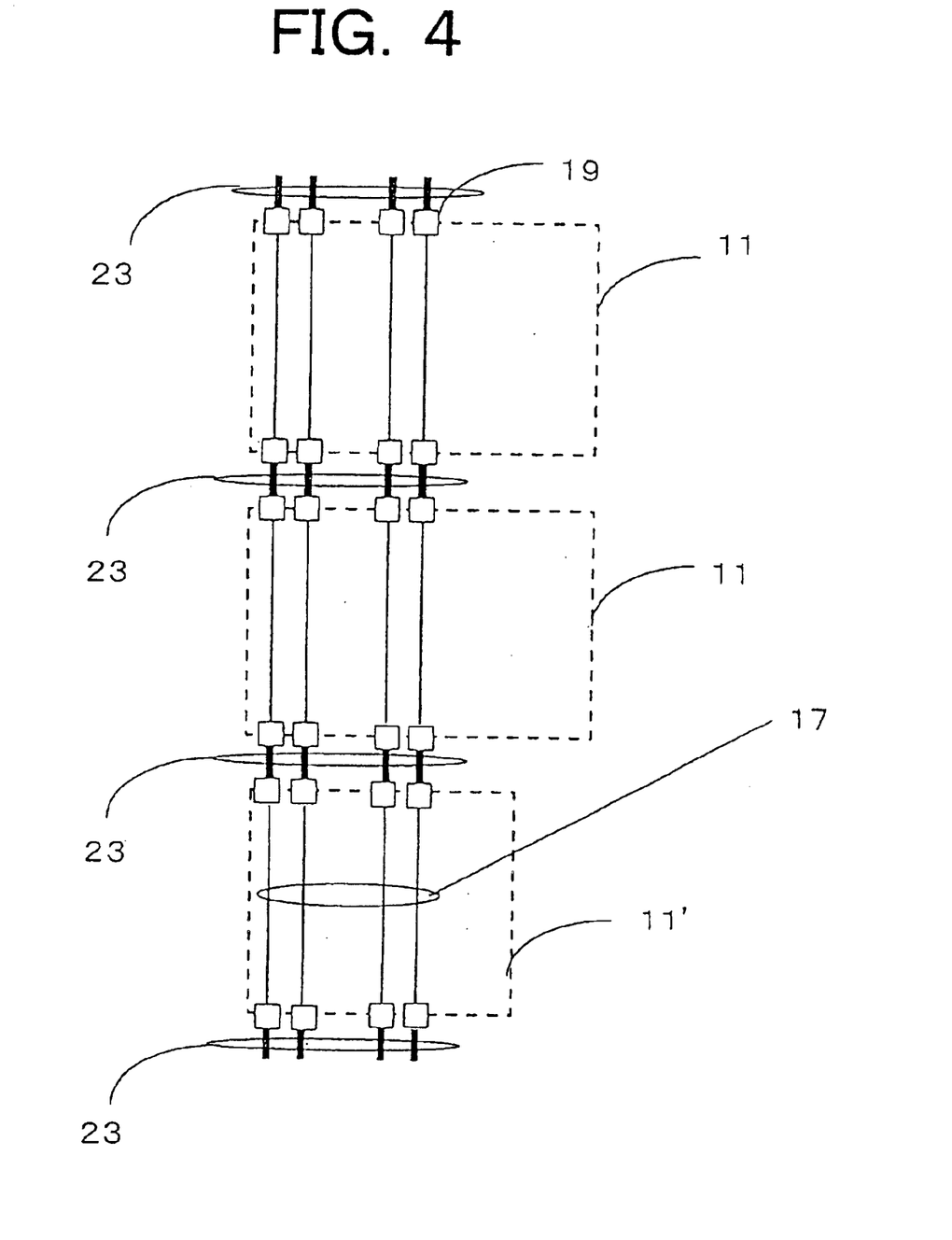
FIG. 4 is a schematic view of a case where a plurality of memory macros of FIG. 3 is disposed.

An example of an arrangement in the high level as a result of taking external wirings onto the memory macro 11 by the above-described method is shown in FIG. 4. FIG. 4 shows a case where three memory macros 11, 11 and 11' are connected together. This method can be said to be extremely effective because by connecting the terminals 19 by higher-layer wirings 23, substantially, it is necessary to add only a wiring region of the higher-layer wirings (memory macro external connection wirings) 23 between the memory macros 11 and the region of the wirings 17 can be significantly reduced. While the higher-layer wirings 23 may be formed by any layer, it is optimum to form them by the sixth layer because the wirings 17 are the sixth layer.

Although its basic structure is the same as that of the memory macro 11, the memory macro 11' of FIG. 4 is different from the memory macro 11 in the size in the horizontal direction of the figure because it has a different memory capacity. However, even in this memory macro 11', a layout with a reduced wiring region is possible by evenly spacing the terminals. Moreover, by attaining consistency not only with the terminal position but also with the mesh wiring width and the mesh wiring interval, wiring can be facilitated.

Figure 5:
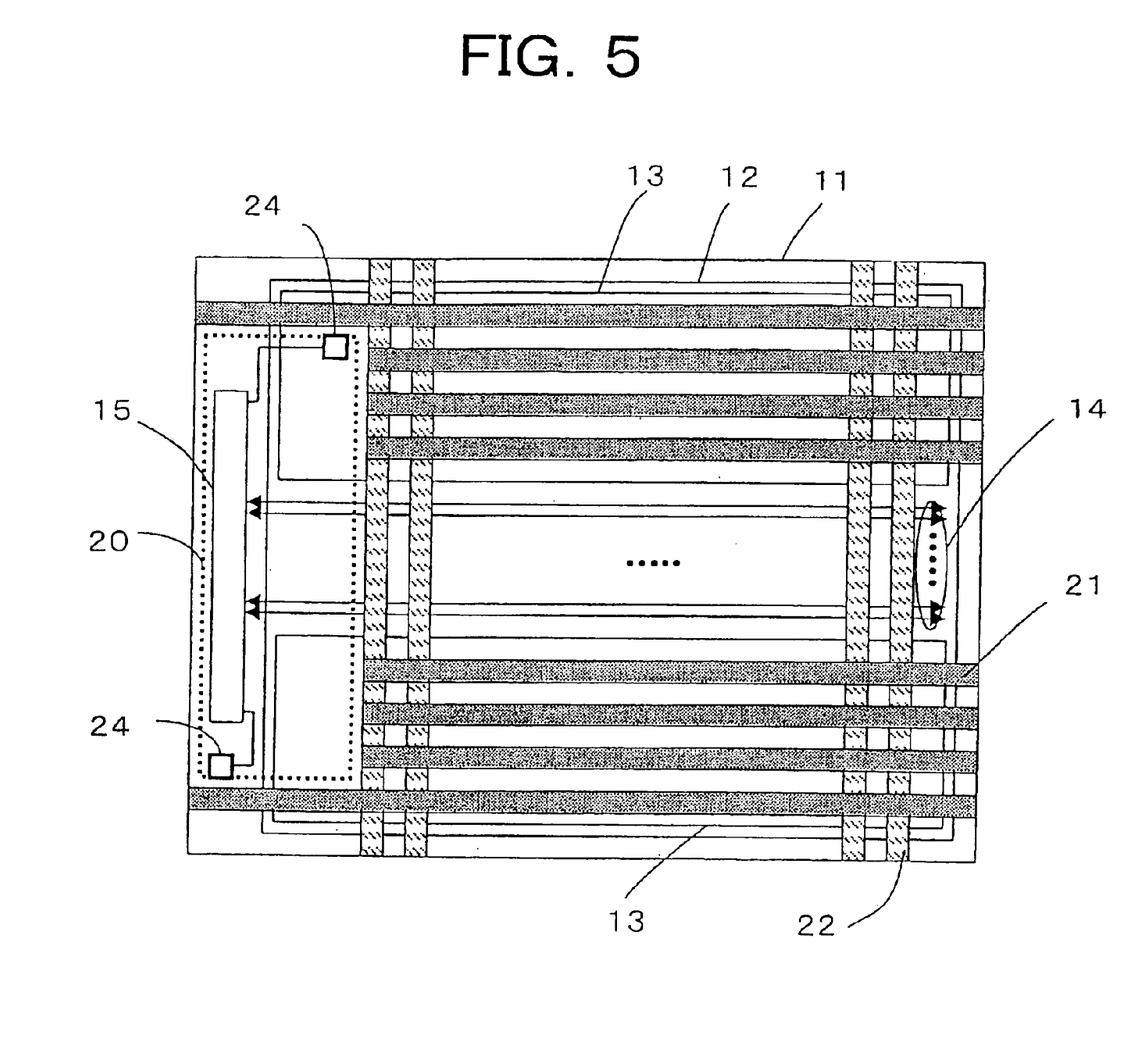
FIG. 5 is a schematic view showing a structure in a case where terminals are disposed inside the memory macro.
Figure 10:
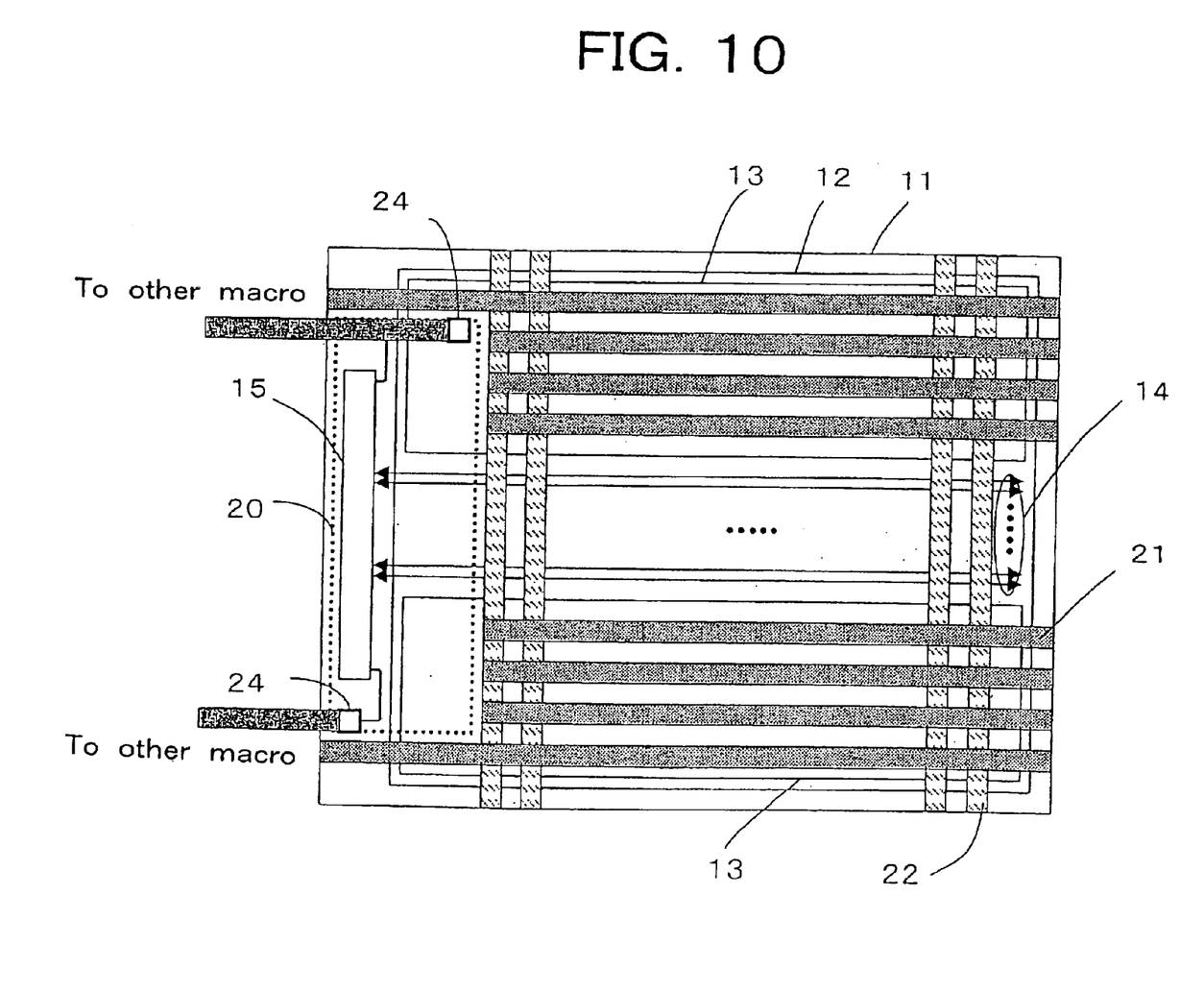
FIG. 10 is a schematic view showing an example in which wirings are placed in a lateral direction from terminals.

FIG. 5 shows a pattern in which instead of disposing the wirings 17 in advance, terminals, that is, intra-memory-macro terminals 24 are disposed not at an end of the memory macro 11 but inside the memory macro 11. The terminal region is secured by the region 20 obtained by deleting a part of the mesh wirings as described above. According to this method, wiring patterns in the high level are not fixed. That is, in FIG. 5, wirings may be placed through the terminals 24 in the longitudinal direction as shown in FIGS. 3 and 4, or wirings may be placed, simply, in the lateral direction, for example, leftward from the terminals 24 as shown in FIG. 10. Therefore, the degree of freedom of wirings in the high level can be increased.

(Second Embodiment)

Next, provision of feed through wiring regions will be described as a second embodiment of the present invention.

Since the wirings 17 can be disposed by use of sixth-layer wirings in the longitudinal direction by the structure shown in FIG. 3, sixth-layer wirings can be disposed on the memory macro 11 in addition to the wirings 17. Therefore, feed through wirings can be freely disposed in the longitudinal direction in FIG. 3. However, feed through wirings cannot be disposed in the lateral direction unless some measure is taken.

However, when disposition of feed through wirings in the vertical and the horizontal directions is enabled by making it possible to dispose them in the lateral direction, the degree of freedom of the layout can be significantly increased.

Therefore, to solve this problem, feed through wiring regions are secured by use of fifth-layer wirings in the lateral direction. To do so, the arrangement of, of the mesh wirings, the lateral wirings 21 disposed in the lateral direction is changed into one like lateral wirings 21' of FIG. 6, thereby obtaining empty spaces. These regions are provided as feed through wiring regions 25.

Figure 7:
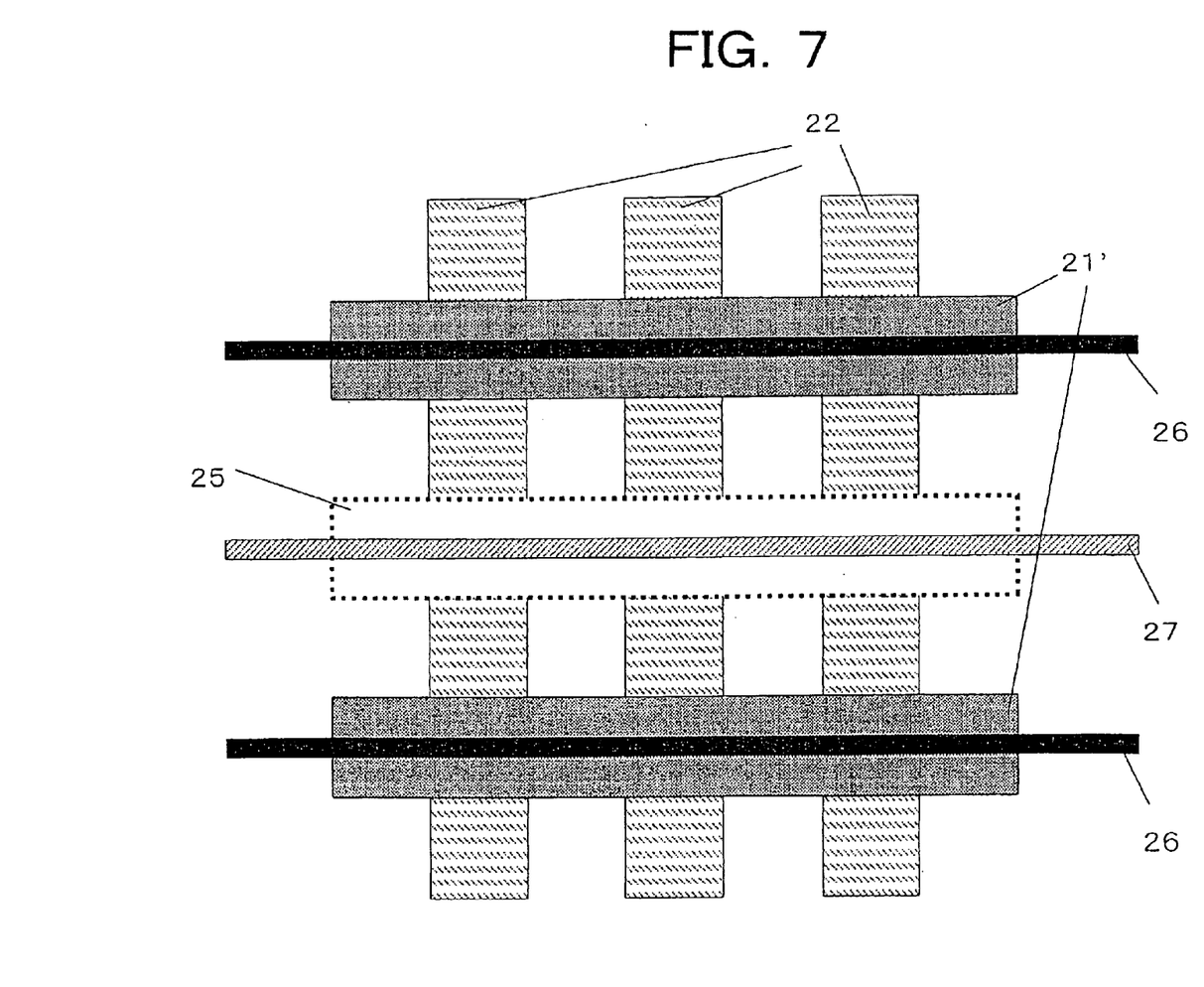
FIG. 7 is a schematic view showing an enlargement of the vicinity of the feed through wiring regions in FIG. 6.

Provision of the regions as the feed through wiring regions 25 is based on the premise that the memory macro 11 itself does not malfunction due to signals disposed in the regions. A measure therefor will be described with reference to FIG. 7. FIG. 7 shows an enlargement of the vicinity of the lateral wirings 21' on both sides of the feed through wiring regions 25. Reference numerals 26 and 27 represent wirings comprising layers lower than the longitudinal wirings 22, or third-layer wirings, that is, intra-memory-macro wirings. The wirings 26 are signal lines, and the wiring 27 is a power or a ground line.

Examples of influences by other signals irrespective of feed through wirings include noise such as coupling, that is, variations in potential. Therefore, to reduce such influences, the regions on the power lines and ground lines 27 where the potential is stable among the third-layer wirings are used as the feed through wiring regions 25, and the lateral wirings 21' are disposed, over the signal lines 26 where influence by noise should be avoided as much as possible, so as to cover the signal lines 26, thereby directly preventing influence by the feed through wirings.

While the fifth-layer wirings are described as the lateral direction in this example, for the longitudinal direction wirings for the longitudinal wirings 22, feed through wiring regions can be formed like the above description.

Figure 6:
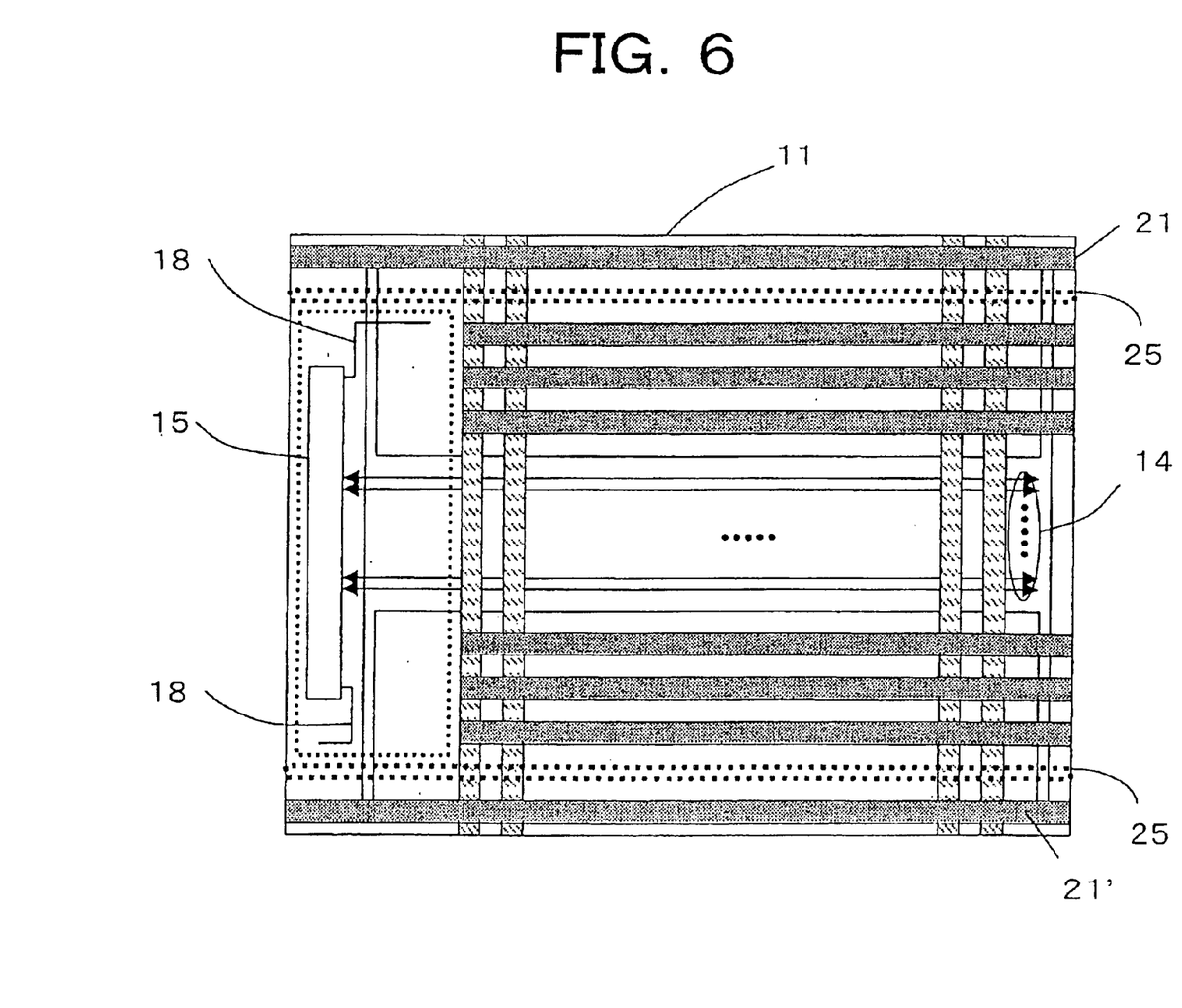
FIG. 6 is a schematic view showing a structure in a case where feed through wiring regions are provided.
Figure 8A:
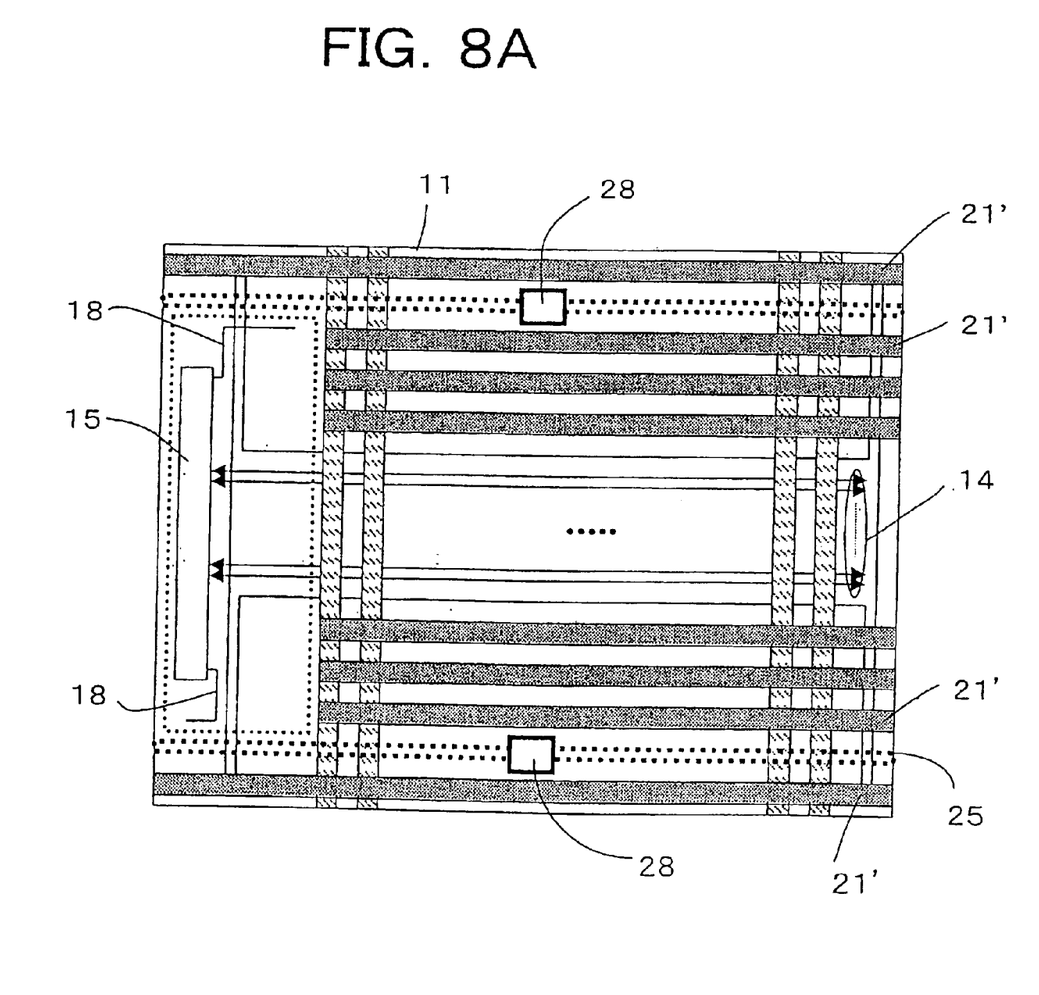
FIGS. 8A and 8B are schematic views showing a condition where buffer circuit blocks are inserted in feed through wiring regions.
Figure 8B:
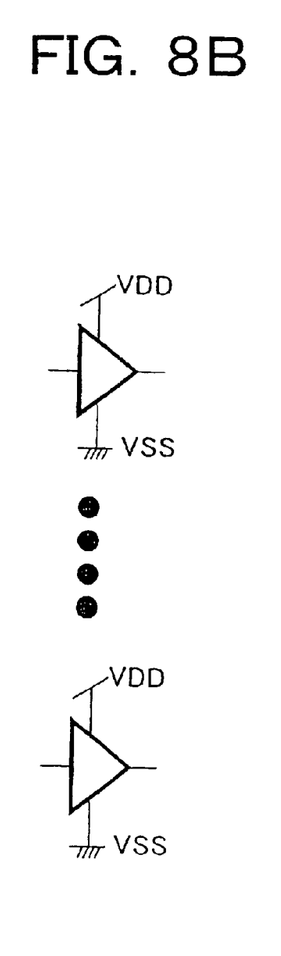

FIGS. 8A and 8B show a structure in which buffer circuits are added to the structure of FIG. 6. When the memory capacity increases to increase the area of the memory macro, the longitudinal and the lateral sizes thereof reaches as large as several millimeters. Consequently, signal blunting and delay on feed through wirings become a problem. However, since only wirings can be disposed in the feed through regions, no measure can be taken against such signal blunting and delay.

Therefore, to solve these problems, buffer circuits for feed through wirings, that is, signal amplifiers are previously disposed in the memory macro 11. In FIG. 8A, reference numeral 28 represents buffer circuit blocks disposed on the feed through wiring regions. The interior of the buffer circuit blocks 28 is shown in FIG. 8B. The buffer circuit blocks 28 comprise a plurality of buffer circuits, and are capable of handling a plurality of feed through wirings disposed in the feed through regions.

Moreover, by parallel-connecting a plurality of buffer circuits on one feed through wiring, the buffer size can be changed according to the load. Moreover, by previously disposing buffer circuits having different sizes, its degree of freedom further improves.

Since these buffer circuits are not used in a memory macro and can be used in the high level, the input signals of the buffer circuits cannot be fixed.

This can be handled by connecting the inputs of the buffer circuits to the power or the ground lines through a high-resistance device. That is, the inputs of the buffer circuits can be fixed.

As another method, the inputs of the buffer circuits can be fixed by releasing the structure as a memory macro with the inputs being open, and connecting the inputs of all the buffers in the high level.

Figure 9:
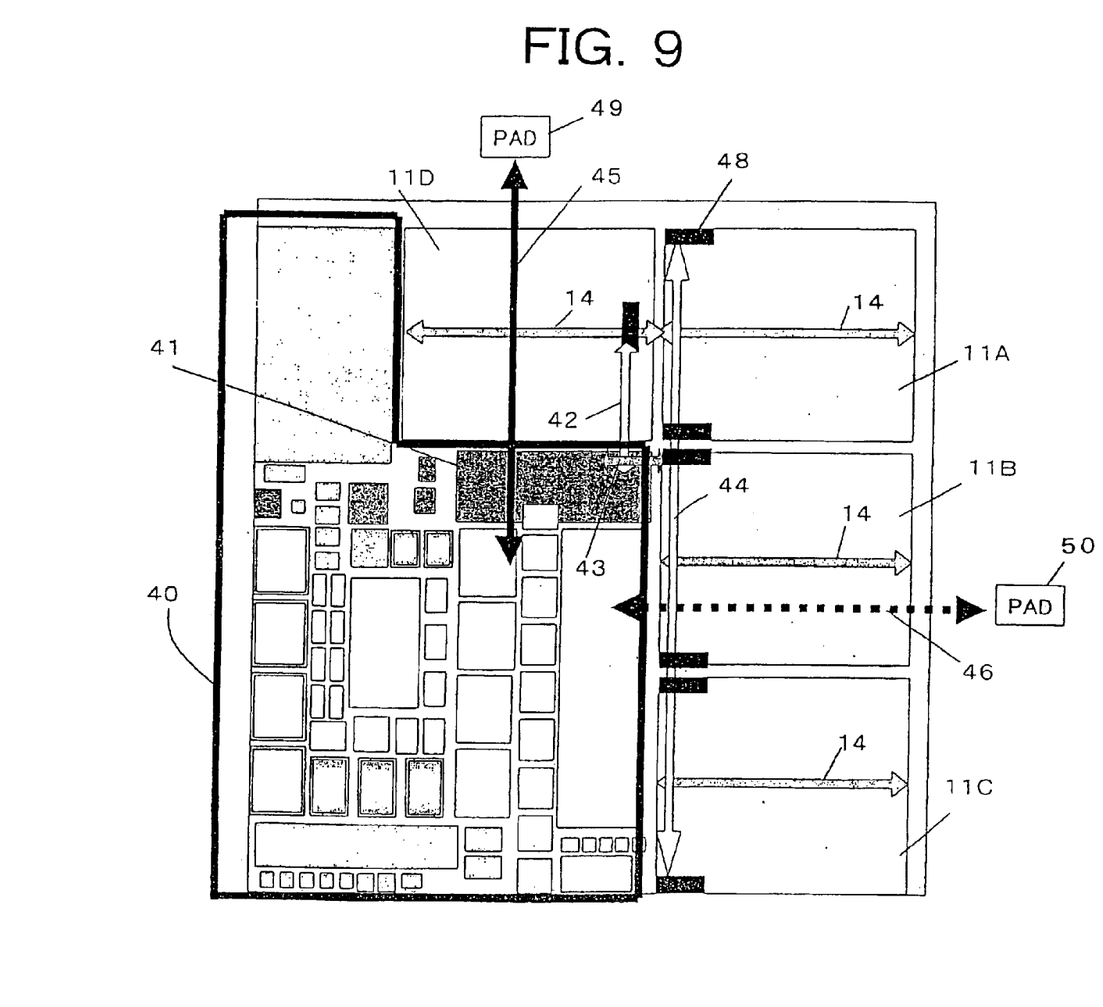
FIG. 9 is a schematic view showing the arrangement of a system LSI provided with memory macros.

FIG. 9 shows the layout of a system LSI provided with a plurality of memory macros. This system LSI comprises four memory macros 11A, 11B, 11C and 11D and a logic circuit 40 other than them. The logic circuit 40 includes a memory control circuit 41 controlling the memory macros 11A to 1D. Connection between the memory control circuit 41 and the memory macros 11A to 11C is made by use of sixth-layer wirings 42 to 44. Reference numeral 45 represents a feed through wiring comprising a sixth-layer wiring. Reference numeral 46 represents a feed through wiring comprising a fifth-layer wiring. Reference numeral 48 represents terminals. Reference numerals 49 and 50 represent pads.

In this system LSI, the four memory macros 11A, 11B, 11C and 11D are disposed. Of these, the memory macros 11A, 11B and 11C correspond to the structure of FIG. 3 having terminals at an end, and the memory macro 11D corresponds to the structure of FIG. 5 having terminals inside. By using the memory macros 11A, 11B, 11C and 11D having different terminal positions like the ones of FIG. 9, wiring regions ready for any floor plan can be taken in the memory macros. Moreover, by enabling the use of feed through wirings in both the longitudinal and the lateral directions, the degree of freedom of wirings from the periphery such as the pads of the chip can be improved. That is, the feed through wiring is formed by use of a sixth-layer wiring when placed in the same direction as the sixth-layer wiring connected to the memory control circuit, and it is formed by use of a fifth-layer wiring when placed in an orthogonal direction. Consequently, the degree of freedom of the layout increases, so that reduction in layout area is facilitated.

What is claimed is:

1. A memory macro comprising: a memory array portion; an interface circuit serving as an interface of the memory array portion; and a wiring region connecting the memory array portion to the interface circuit, wherein mesh power wirings comprising first and second wiring layers are provided on the memory array portion; the interface circuit is connected to a plurality of signal lines comprising a third wiring layer provided on the memory array portion, the interface circuit or the wiring region, through an intermediate wiring comprising the second wiring layer; a region where the intermediate wiring is provided comprises a region on the memory array portion or on the wiring region; and the mesh power wiring comprising the second wiring layer is not present on the region where the intermediate wiring is provided.

2. A memory macro according to claim 1, wherein the plurality of signal lines are placed from one side of a region including the memory array portion, the interface circuit and the wiring region, to an opposite side of the region, and a signal terminal is provided on each end of each of the signal lines.

3. A memory macro according to claim 2, wherein specifications are provided for a position, a width, an interval and the like of the signal terminal on each end of the plurality of signal lines so that consistency with other macro is attained.

4. A memory macro comprising: a memory array portion; an interface circuit serving as an interface of the memory array portion; and a wiring region connecting the memory array portion to the interface circuit, wherein mesh power wirings comprising first and second wiring layers are provided on a region on the memory array portion; the interface circuit is connected to a terminal for connection to a plurality of signal lines provided on the memory array portion, the interface circuit or the wiring region, through an intermediate wiring comprising the second wiring layer; a region where the intermediate wiring is provided comprises a region on the memory array portion or on the wiring region; and the mesh power wiring comprising the second wiring layer is not present on the region where the intermediate wiring is provided.

5. A memory macro according to claim 1, wherein the memory array portion and the interface circuit are structured by use of a wiring layer other than the first, the second and the third wiring layers.

6. A memory macro according to claim 1, wherein power terminals supplying power to the power wirings is provided at least on opposing two sides of a region including the memory array portion, and specifications are provided for a position, a width, an interval and the like of the power terminals so that consistency with other macro is attained.

7. A memory macro according to claim 1, wherein the first wiring layer consist of a fourth layer of six layers of metal wirings, the second wiring layer consist of a fifth layer of the six layers of metal wirings, and the third wiring layer consist of a sixth layer of the six layers of metal wirings.

8. A memory macro according to claim 1, wherein in a region including the memory array portion, the interface circuit and the wiring region, the interface circuit is disposed at an end.

9. A memory macro according to claim 8, wherein the region including the memory array portion, the interface circuit and the wiring region has a convex shape where the interface circuit is situated in a protruding part, and other circuit block is formed in a dead space present at a side of the protruding part where the interface circuit is disposed.

10. A memory macro according to claim 1, wherein a region for feed through comprising the second wiring layer is provided on the memory array portion, the interface circuit or the wiring region.

11. A memory macro according to claim 10, wherein the region for feed through is provided on the region where the mesh power wiring comprising the second wiring layer is not present; the mesh power wiring comprising the second wiring layer is present on a signal line comprising a wiring layer other than the second wiring layer which signal line is on the memory array portion, the interface circuit or the wiring region; and the region for feed through is disposed on a region where the signal line comprising the wiring layer other than the second wiring layer which signal line is on the memory array portion, the interface circuit or the wiring region is not present or on a power line or a ground line on the memory array portion, the interface circuit or the wiring region.

12. A memory macro according to claim 11, wherein a first circuit for feed through wiring is provided in the wiring region.

13. A memory macro according to claim 12, wherein the first circuit is a signal amplifier.

14. A memory macro according to claim 13, wherein an input terminal of the first circuit is fixed at a power potential or a ground potential through a high-resistance device on the memory array portion, the interface circuit or the wiring region, and is connected to the signal line when the first circuit is used as a buffer.

15. A semiconductor integrated circuit wherein the memory macro according to claim 1 is provided; when a signal line is placed in a direction that crosses the signal lines comprising the third wiring layer, the signal line is provided on the memory macro by use of the second wiring layer, and when the signal line is placed parallel to the signal lines comprising the third wiring layer, the signal line is provided on the memory macro by use of the third wiring layer.

16. A semiconductor integrated circuit comprising at least one memory macro and other macro, wherein the at least one memory macro comprises: a memory array portion; an interface circuit serving as an interface of the memory array portion; and a wiring region connecting the memory array portion to the interface circuit, and wherein mesh power wirings comprising first and second wiring layers are provided on the memory array portion; the interface circuit is connected to a plurality of signal lines comprising a third wiring layer provided on the memory array portion, the interface circuit or the wiring region, through an intermediate wiring comprising the second wiring layer; a region where the intermediate wiring is provided comprises a region on the memory array portion or on the wiring region; and the mesh power wiring comprising the second wiring layer is not present on the region where the intermediate wiring is provided.

17. A semiconductor integrated circuit according to claim 16, wherein a region for feed through comprising the second wiring layer is provided on the memory array portion, the interface circuit or the wiring region.

18. A semiconductor integrated circuit according to claim 17, wherein the region for feed through is provided on the region where the mesh power wiring comprising the second wiring layer is not present; the mesh power wiring comprising the second wiring layer is present on a signal line comprising a wiring layer other than the second wiring layer which signal line is on the memory array portion, the interface circuit or the wiring region; and the region for feed through is disposed on a region where the signal line comprising the wiring layer other than the second wiring layer which signal line is on the memory array portion, the interface circuit or the wiring region is not present or on a power line or a ground line on the memory array portion, the interface circuit or the wiring region.

* * * * *